(12) United States Patent
Miller

(10) Patent No.: US 11,070,066 B2
(45) Date of Patent: Jul. 20, 2021

(54) PASSIVE BATTERY CELL DISCHARGE

(71) Applicant: Caterpillar Inc., Deerfield, IL (US)

(72) Inventor: Jason Miller, Princeville, IL (US)

(73) Assignee: Caterpillar Inc., Peoria, IL (US)

(\*) Notice: Subject to any disclaimer, the term of this patent is extended or adjusted under 35 U.S.C. 154(b) by 180 days.

(21) Appl. No.: 16/375,031

(22) Filed: Apr. 4, 2019

(65) Prior Publication Data

US 2020/0321787 A1 Oct. 8, 2020

(51) Int. Cl.
- *H02J 7/00* (2006.01)
- *G01R 31/382* (2019.01)
- *H01M 10/42* (2006.01)
- *H01M 10/44* (2006.01)

(52) U.S. Cl.
CPC .......... *H02J 7/0016* (2013.01); *G01R 31/382* (2019.01); *H01M 10/4257* (2013.01); *H01M 10/441* (2013.01); *H01M 2010/4271* (2013.01); *H01M 2220/20* (2013.01)

(58) Field of Classification Search
CPC ............... H02J 7/0016; G01R 31/382; H01M 10/4257; H01M 10/441; H01M 2010/4271; H01M 2220/20
USPC ........................................................ 320/132
See application file for complete search history.

(56) References Cited

U.S. PATENT DOCUMENTS

| | | | | |
|---|---|---|---|---|
| 5,362,942 A | * | 11/1994 | Vanderslice, Jr. | H01M 10/633 219/209 |
| 6,133,707 A | * | 10/2000 | Kikuchi | B60L 58/10 320/104 |
| 6,611,128 B2 | * | 8/2003 | Minamiura | B60L 58/26 320/134 |
| 6,812,670 B2 | * | 11/2004 | Minamiura | H02J 7/0022 320/116 |
| 7,583,053 B2 | * | 9/2009 | Kamohara | F02N 11/0862 320/106 |
| 7,602,145 B2 | | 10/2009 | Renda | |
| 8,427,105 B2 | * | 4/2013 | Plett | H01M 10/482 320/116 |
| 8,736,229 B2 | * | 5/2014 | Kawahara | B60L 58/15 320/116 |
| 8,773,068 B2 | * | 7/2014 | Nysen | H01M 10/441 320/116 |
| 8,859,119 B2 | * | 10/2014 | Robertson | H01M 10/6563 429/50 |

(Continued)

*Primary Examiner* — M Baye Diao
(74) *Attorney, Agent, or Firm* — Harrity & Harrity LLP

(57) ABSTRACT

A battery management component for passive battery cell discharge is disclosed. The battery management component may determine that a charging operation associated with a battery has ended. The battery management component may identify, based on the charging operation ending, that a first cell of the battery has a first state of charge. The battery management component may determine that a second cell of the battery has a second state of charge that is outside of a threshold range of the first state of charge. The battery management component may determine, based on the first and second states of charge, an amount of energy to be removed from the first cell to enable the first state of charge to be within the threshold range of the second state of charge. The battery management component may discharge energy from the first cell based on the determined amount of energy.

20 Claims, 4 Drawing Sheets

(56) References Cited

U.S. PATENT DOCUMENTS

| | | | | |
|---|---|---|---|---|
| 9,018,892 | B2* | 4/2015 | Agarwal | H02J 7/0016 320/101 |
| 9,112,361 | B2* | 8/2015 | Schumm, Jr. | H01M 10/443 |
| 9,209,630 | B2 | 12/2015 | Naghshtabrizi et al. | |
| 9,496,730 | B2* | 11/2016 | Gallegos | B60L 50/40 |
| 9,768,624 | B2* | 9/2017 | Becker | B60L 58/12 |
| 9,887,560 | B2* | 2/2018 | Banos | H02J 7/0031 |
| 9,893,385 | B1* | 2/2018 | Nayar | H01M 10/486 |
| 10,177,581 | B2* | 1/2019 | Yamazaki | H02J 7/0016 |
| 10,263,436 | B2* | 4/2019 | Beaston | H02J 7/0021 |
| 10,547,184 | B2* | 1/2020 | Carralero | H02J 7/0014 |
| 10,574,063 | B2* | 2/2020 | Hellgren | H02J 7/0016 |
| 2005/0275372 | A1* | 12/2005 | Crowell | H02J 7/0018 320/112 |
| 2011/0089905 | A1* | 4/2011 | Yano | H01M 10/486 320/132 |
| 2011/0127960 | A1* | 6/2011 | Plett | H01M 10/486 320/116 |
| 2011/0316486 | A1* | 12/2011 | Inaba | H01M 10/48 320/150 |
| 2011/0316520 | A1* | 12/2011 | Kawahara | B60L 50/51 323/351 |
| 2012/0187907 | A1* | 7/2012 | Nysen | H01M 10/052 320/116 |
| 2013/0328529 | A1* | 12/2013 | Zbrozek | H02J 7/0016 320/118 |
| 2014/0176084 | A1* | 6/2014 | Geantil | H02J 7/0021 320/152 |
| 2016/0241058 | A1* | 8/2016 | Carralero | H02J 7/007 |
| 2020/0203960 | A1* | 6/2020 | Hoyt | H02J 7/0016 |

\* cited by examiner

PASSIVE BATTERY CELL DISCHARGE

TECHNICAL FIELD

The present disclosure relates generally to a battery and, more particularly, to passive battery cell discharge.

BACKGROUND

A battery may include a plurality of battery cells (referred to herein individually as a "cell" and collectively as "cells") that may have various states of charge. In other words, the amount of energy in each of the cells of the battery may be unbalanced relative one another. While being charged, energy is provided to all cells of the battery. If one cell reaches a maximum state of charge, the charger does not continue to provide energy to the battery. Cell balancing enables energy to be released from the cell that has reached a maximum state of charge to permit the charger to continue to provide energy to the remaining cells. Cell balancing typically occurs while the battery is charging, while the cells of the battery are in a steady state, which allows for increased accuracy in determining the state of charge of the cells relative to when the cells of the battery are not in a steady state or while the battery is not charging. However, problems may arise due to the relatively long amounts of time that cell balancing can take while charging, thus preventing a machine utilizing the battery from being operational because the machine needs to remain connected to the battery charger until cell balancing completes.

One approach to a balancing circuit for a battery is disclosed in U.S. Pat. No. 9,209,630 that issued to Naghshtabrizi et al. on Dec. 8, 2015 ("the '630 patent"). In particular, the '630 patent discloses the balancing circuit having two operation modes. The first operation mode, i.e., the top balancing operation mode, involves discharging charge from the entire battery pack and then charging selective cells (namely, one or more low charged cells) of the battery pack. The intended result of the first operation mode is that extra charge is removed from the high charged cells and transferred to the low charged cells. The second operation mode, i.e., the bottom balancing operation mode, involves discharging charge from selective cells (namely, one or more high charged cells) of battery pack and then charging the entire battery pack with the discharged charge. Again, the intended result of the second operation mode is that extra charge is removed from the high charged cells and transferred to the low charged cells.

While the balancing circuit of the '630 patent may balance states of charge of cells of a battery, the balancing circuit does not passively discharge a cell after a charging operation has ended.

The battery management component of the present disclosure solves one or more of the problems set forth above and/or other problems in the art.

SUMMARY

According to some implementations, a method may include determining that a charging operation associated with a battery has ended; identifying, based on determining that the charging operation has ended, that a first cell of the battery has a first state of charge; determining that a second cell of the battery has a second state of charge that is outside of a threshold range of the first state of charge; determining, based on the first state of charge and the second state of charge, an amount of energy that is to be removed from the first cell to enable the second state of charge to be within the threshold range of the first state of charge; and discharging energy from the first cell based on the determined amount of energy.

According to some implementations, a device may include one or more memories; and one or more processors, communicatively coupled to the one or more memories, to: determine that a charging operation associated with a battery has ended; determine, based on determining that the charging operation has ended, a plurality of states of charge of a plurality of cells of the battery; identify a lowest state of charge of the plurality of states of charge; determine that a set of states of charge of corresponding cells, of the plurality of cells, are outside of a threshold range of the lowest state of charge ; determine respective amounts of energy that are to be removed from the corresponding cells to enable the states of charge of the corresponding cells to be within the threshold range from the lowest state of charge; and activate, for corresponding durations, bleed resistors associated with respective cells of the set of cells, wherein lengths of the corresponding durations are based on the corresponding amounts of energy that are determined to be removed from the respective cells of the set of cells.

According to some implementations, a system may include a battery that includes a plurality of cells; a plurality of bleed resistors coupled to the plurality of cells; and a battery controller configured to: determine that a charging operation associated with the battery has ended; compare, based on determining that the charging operation has ended, states of charge associated with the plurality of cells; determine, based on comparing the states of charge, that a first state of charge of a first cell of the plurality of cells is unbalanced relative to a second state of charge of a second cell of the plurality of cells; estimate, based on a difference between the first state of charge and the second state of charge, an amount of energy that is to be removed from the first cell to balance the first state of charge with the second state of charge; and discharge, via a bleed resistor of the plurality of bleed resistors, energy from the first cell based on the estimated amount of energy.

DETAILED DESCRIPTION

Figure 1:
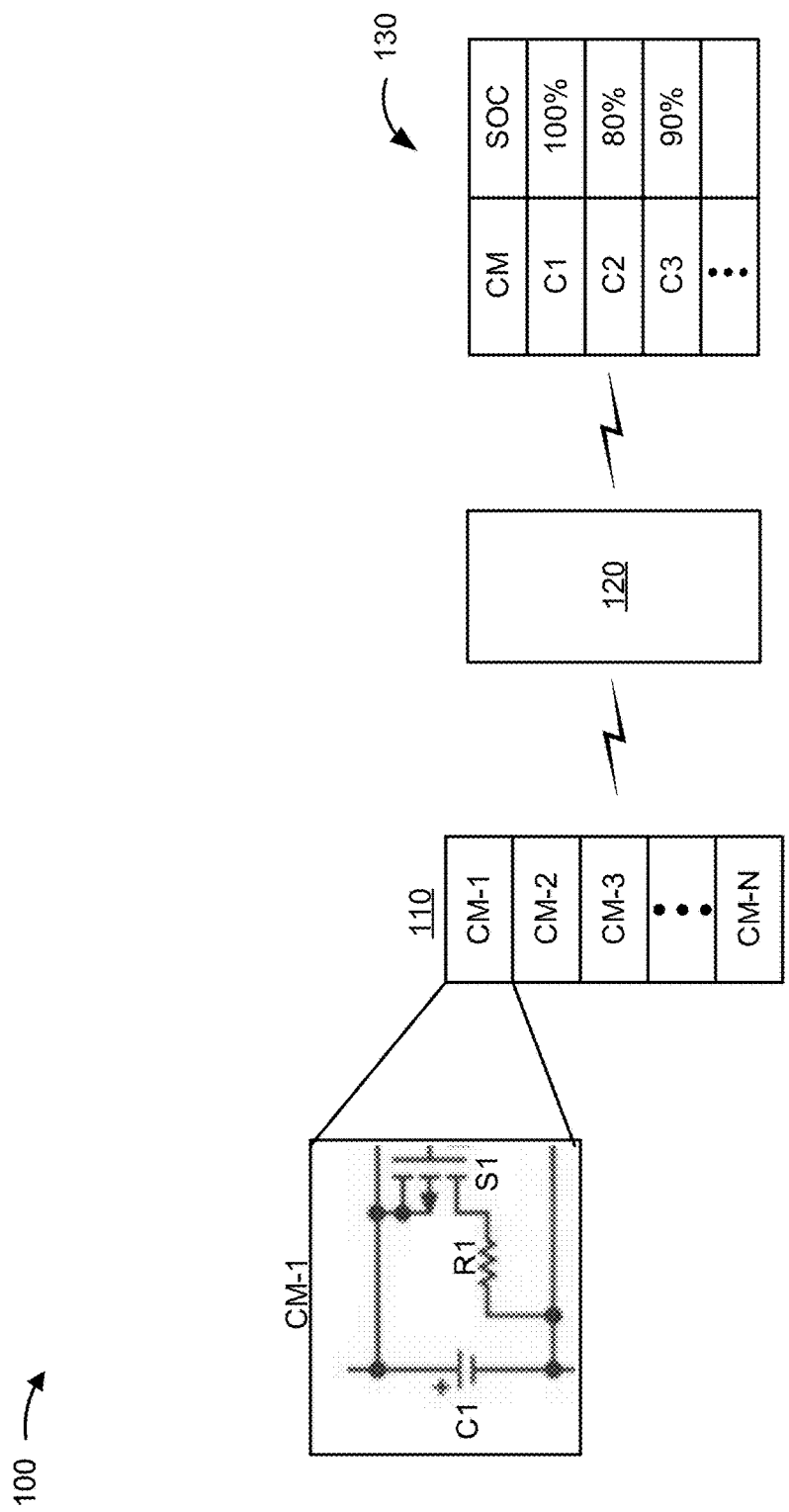
FIG. 1 is diagram of an example system for passive battery cell discharge described herein.

FIG. 1 is a diagram of an example system 100 for passive battery cell discharge described herein. System 100 includes a battery 110, a battery management component 120, and a state of charge storage 130. As shown in FIG. 1, battery 110 includes a plurality of cells (referred to individually as a "cell" and collectively as "cells") that are included within cell modules (shown as CM-1 to CM-N, where N is an integer and N≥1) (referred to individually as a "cell module" and collectively as "cell modules"). Furthermore, as shown, a cell module may include a bleed resistor (e.g., a resistor have an electrical resistance (in Ohms), a load that absorbs power, and/or the like) and a switch that are used to discharge energy from the cell of the cell module, as described herein. Accordingly, as shown, a first cell module CM-1 may include circuitry that includes a cell C1, a bleed resistor R1, and a switch S1 to enable passive cell balancing as described herein. The remaining cell modules (CM-2 to CM-N) may include corresponding circuitry. In system 100 of FIG. 1, battery management component 120 may use state of charge information from state of charge storage 130 to determine amounts of energy that are to be discharged from cells of battery 110 and use the switches and/or bleed resistors of the cell modules to discharge the corresponding amounts of energy.

Battery 110 may be configured to suitably provide power for a machine (not shown). Such a machine may include an electrical generator, mechanical machinery, a movable machine, and/or the like. Battery 110 may be used to provide electrical power to an electrically powered system of a movable machine, to start the movable machine, and/or cause movement of the movable machine. Such a movable machine may be an autonomous vehicle, a non-autonomous vehicle, a semi-autonomous vehicle, and/or the like. Correspondingly, system 100 may be located on such a machine. For example, battery management component 120 and/or state of charge storage 130 may be associated with and/or included within an electronic control unit (ECU) of the machine.

As described herein, battery management component 120 may be configured to perform cell balancing by controlling the cell modules to discharge energy from cells using the switches and the bleed resistors. Battery management component 120 may activate a bleed resistor of a cell module by closing a switch coupled to the bleed resistor and a power output (e.g., a positive terminal) of a cell of the cell module. The bleed resistor may withdraw the energy from the cell and permit the energy to be dissipated to a ground coupled to the resistor (e.g., a negative terminal of the cell).

State of charge storage 130 may include any suitable data structure (e.g., a table, an index, a database, a graph, and/or the like) that is configured to store information identifying states of charge (which may be referred to herein as "state of charge information") of the cells of battery 110. The state of charge information, for each cell, may be based on and/or representative of a measured voltage (e.g., a measured output voltage) and/or a measured current (e.g., a charge current corresponding to a rate of charge) associated with the cell. Battery management component 120 may maintain the state of charge information in state of charge storage 130 by recording the states of charge of the cells during a charging operation of battery 110. For example, while battery 110 is connected to a battery charger, battery management component 120 may determine the states of charge of the cells of battery 110 and record the state of charge information in state of charge storage 130. The state of charge information may correspond to a most recently measured state of charge of the cells during the charging operation. Accordingly, the information identifying the states of charge may be updated and/or overwritten, over the course of the charging operation, with the most recent state of charge.

Battery management component 120 may perform cell balancing based on the state of charge information stored in state of charge storage 130. For example, battery management component 120 may compare states of charge of the cells of battery 110 to determine whether two or more of the cells are balanced. In such a case, battery management component 120 may determine whether the two or more cells are within a threshold range of one another. The threshold range may be a fixed range that is relative to a maximum state of charge (e.g., maximum possible state of charge) of a cell. In such a case, the threshold range is set to 5% and a maximum state of charge is 100%, the threshold range may be a fixed +/−5% of the state of charge of a cell, regardless of the value of the state of charge of the cell. Alternatively, the threshold range may be a variable range that is relative to a state of charge of a cell (e.g., the cell battery 110 that has a lowest state of charge). In such a case, for a threshold range that is set to 5% and a cell that has a state of charge that is 50%, the threshold range would be +/−2.5% of the state of charge of that cell (not +/−5% as described above with respect to the fixed range).

Battery management component 120 may compare states of charge, indicated in state of charge storage 130, for a pair of cells of battery 110. If battery management component 120 determines that the states of charge for the pair of cells of battery 110 are outside of a threshold range (e.g., different by a threshold amount from each other), battery management component 120 may determine that the pair of cells of battery 110 are not balanced and that passive cell balancing is to be performed.

Accordingly, battery management component 120 may perform passive cell balancing for the pair of cells, by closing a switch of the cell module of the cell that has a higher state of charge to activate the bleed resistor to discharge energy from that cell. Battery management component 120 may close the switch to activate the bleed resistor for a length of time that brings the state of charge of that cell into balance with the other cell that had the lower state of charge (e.g., within a threshold range of each other). The battery management component may determine the length of time that the bleed resistor is to discharge energy (or that the switch is to be closed) based on the amount of energy that is to be discharged from the cell. Such an amount of energy may be based on a determined difference between the states of charge of the pair of cells.

Battery management component 120 may identify a cell with a lowest state of charge in state of charge storage 130. Battery management component 120 may then compare the lowest state of charge to the states of charge of the remaining cells of battery 110. Based on the differences between the cell with the lowest state of charge and the states of charge of the remaining cells, battery management component 120 may calculate respective amounts of energy that are to be discharged from each of the remaining cells so that the remaining cells have an amount of energy that corresponds to the lowest state of charge. Therefore, after discharging the respective amounts of energy, all cells of battery 110 may be within balance (e.g., within a threshold range of one another).

As a specific example, referring to the example of FIG. 1, for cells C1, C2, C3 to be balanced, states of charge of those cells may be required to be within two percent (relative to a maximum state of charge) of each other. Accordingly, battery management component 120 may determine that the cells C1, C2, or C3 are unbalanced due to the difference in the states of charge of the cells C1, C2, and C3 being 100%, 80%, and 90%, respectively, being outside of a threshold range of two percent (e.g., 90% is 10% more than 80% and 100% is 20% more than 80% and 10% and 20% are greater than 2%). To bring cells C1 and C2 within balance, battery management component 120 may determine a length of time that bleed resistor R1 is to be activated to discharge energy from C1. Further, to bring cells C3 and C2 within balance, battery management component 120 may determine a length of time that a bleed resistor R3 associated with C3 is to be activated (e.g., by closing a switch S3). Due to the difference between the states of charge of C2 and C1 being different from the difference between the states of charge of C2 and C3, the length of time that the bleed resistor R1 is activated may be different from the length of time that the bleed resistor R3 is activated (e.g., when R1 and R3 have a same resistance (R1=R3), R1 may be activated for a longer time than R3). In this way, battery management component 120 may determine amounts of energy that are to be discharged from cells C1 and C3 to bring cells C1, C2, and C3 within balance.

In some implementations, battery management component 120 may store the information identifying the state of charge in state of charge storage 130 based on the charging operation having ended. State of charge storage 130 may correspond to a non-volatile storage. In such an example, battery management component 120 may maintain most recent states of charge in a volatile memory of battery management component 120, and persist the information identifying the most recently measured states of charge in state of charge storage 130 when battery management component 120 determines that the charging operation has ended (e.g., when battery management component 120 determines that battery 110 has been disconnected from a charger).

Accordingly, after a power source that powers state of charge storage 130 has been disconnected or disabled, battery management component 120 may have access to and/or obtain information associated with most recently measured states of charge of the cells of battery 110. In this way, battery management component 120 may refer to state of charge storage 130 upon startup of the machine (e.g., when the machine is powered on) and perform cell balancing based on the machine being powered on. Therefore, in the event of a shutdown of the machine during passive discharging of one or more cells of battery 110, battery management component 120 may track the lengths of time that each bleed resistor has been activated. Such lengths of time can be compared with total lengths of time needed to discharge the cells to bring the cells of the battery within balance (which may correspond to the persisted states of charge in state of charge storage 130), and battery management component 120 may correspondingly resume passive discharging of the cells for the remaining lengths of time upon startup of the machine.

Therefore, battery management component 120 may perform passive cell balancing while a machine is under operation using state of charge information that was stored during a charging operation. Such cell balancing may be performed after battery management component 120 determines that a charging operation involving battery 110 has ended (e.g., based on battery 110 being disconnected from a battery charger).

As indicated above, FIG. 1 is provided as an example. Other examples may differ from what was described in connection with FIG. 1.

Figure 2:
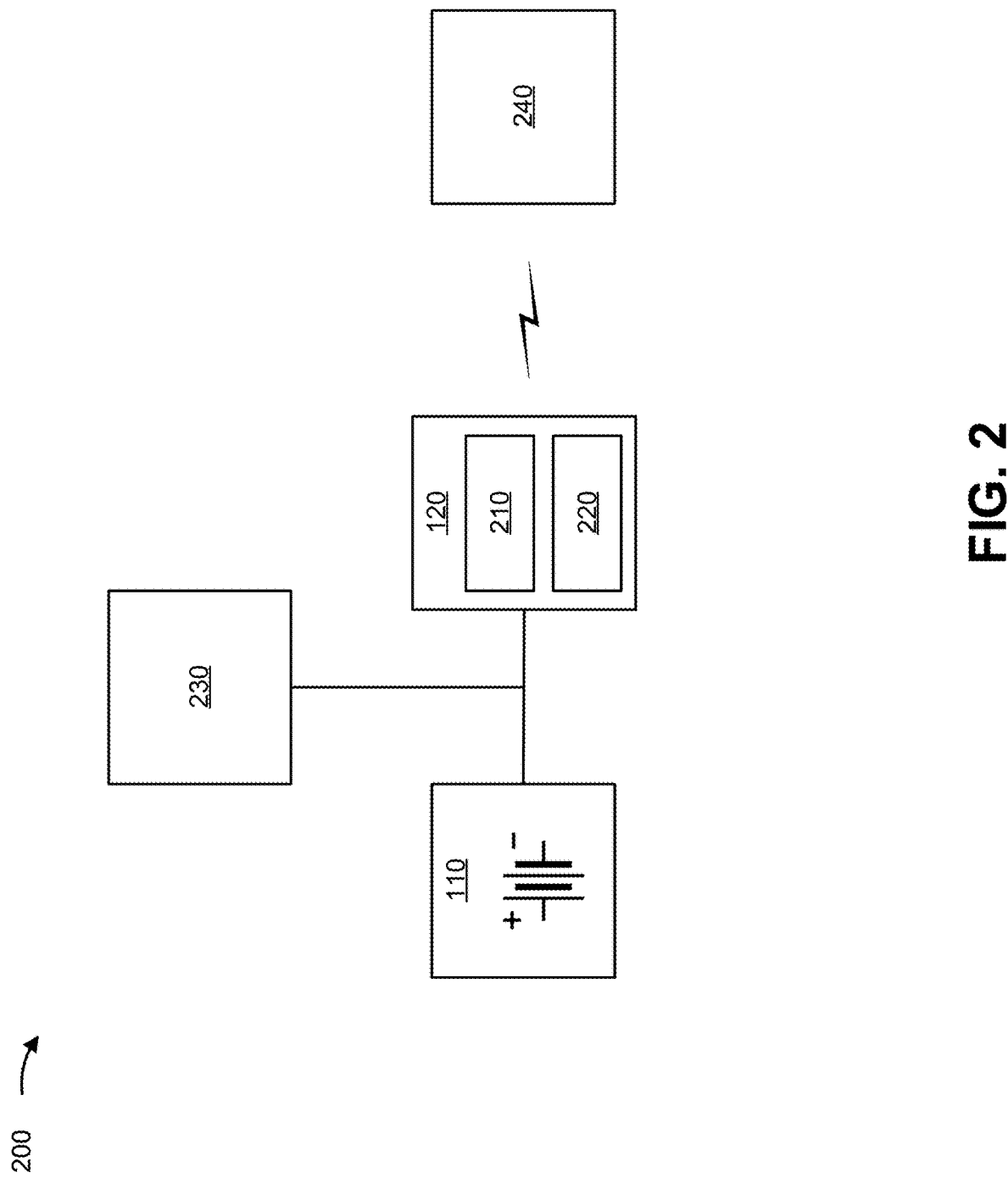
FIG. 2 is a diagram of an example environment in which systems and/or methods described herein may be implemented.

FIG. 2 is a diagram of an example environment 200 in which systems and/or methods, described herein, may be implemented. As shown in FIG. 2, environment 200 may include a battery 110, a battery management component 120 with a processor 210 and a memory 220, a battery charger 230, and a user device 240. Devices of environment 200 may interconnect via wired connections, wireless connections, or a combination of wired and wireless connections.

Battery 110 may include one or more devices capable of generating, storing, and/or providing energy for a power system and/or machine as described herein. Battery 110 may be a multi-cell battery with separate cells that may be individually charged at various rates, that may individually provide energy at various rates, and/or the like. Accordingly, over a particular time period, the cells of battery 110 may have various states of charge, as described herein. Battery 110 may correspond to battery 110 of FIG. 1.

Battery management component 120 may include one or more devices capable of generating, storing, processing, and/or providing information associated with passive cell balancing, as described herein. Battery management component 120 may correspond to battery management component 120 of FIG. 1. In some implementations, battery management component 120 may include and/or be associated with the cell modules of system 100.

Battery management component 120 includes processor 210 and memory 220. Processor 210 is implemented in hardware, firmware, and/or a combination of hardware and software. Processor 210 is a central processing unit (CPU), a graphics processing unit (GPU), an accelerated processing unit (APU), a microprocessor, a microcontroller, a digital signal processor (DSP), a field-programmable gate array (FPGA), an application-specific integrated circuit (ASIC), or another type of processing component. Processor 210 includes one or more processors capable of being programmed to perform a function.

Memory 220 includes a random-access memory (RAM), a read only memory (ROM), and/or another type of dynamic or static storage device (e.g., a flash memory, a magnetic memory, and/or an optical memory) that stores information and/or instructions for use by processor 210. In some implementations, memory 220 may include and/or be communicatively coupled with a storage component that stores information and/or software related to the operation and use of battery management component 120. The storage component may include a hard disk (e.g., a magnetic disk, an optical disk, and/or a magneto-optic disk), a solid-state drive (SSD), a compact disc (CD), a digital versatile disc (DVD), a floppy disk, a cartridge, a magnetic tape, and/or another type of non-transitory computer-readable medium, along with a corresponding drive.

Battery charger 230 may include one or more devices capable of generating, storing, converting, and/or providing energy to battery 110. For example, battery charger 230 may include a power source and/or a device configured to convert power from a power source to power that can be stored as energy within cells of battery 110. Battery charger 230 may perform one or more charging operations when battery 110 is connected to (e.g., for wired charging) terminals of battery 110 and/or when battery 110 is within a charging range of battery charger 230 (e.g., for wireless charging). In some implementations, battery charger 230 may include one or more controllable devices (e.g., switches and/or mechanical devices) that may be used to begin and/or end a charging operation.

Battery management component 120 may be capable of communicating with battery charger 230 to cause battery charger 230 to begin and/or end a charging operation with battery 110. Battery management component 120 may monitor a charging operation associated with battery 110 and battery charger 230. Based on battery management component 120 determining that a cell of battery 110 has reached a maximum state of charge, battery management component 120 may instruct battery charger 230 to end a charging operation. Battery management component 120 may instruct battery charger 230 to automatically disconnect from battery 110 (e.g., battery charger 230 may use one or more mechanical devices to disconnect from terminals of battery 110). Additionally, or alternatively, battery management component 120 may instruct and/or cause one or more components of a machine (e.g., an autonomous vehicle) to end the charging operation and/or disconnect battery charger 230 from battery 110.

Battery management component 120 may perform a passive cell battery balancing within a threshold time period (e.g., one minute, five minutes, ten minutes, and/or the like) of detecting that a charging operation has ended. For example, battery management component 120 may be configured to determine states of charge of the cells of battery 110 and balance the states of charge, as described herein, within a threshold time period to ensure that the most recently measured states of charge during the charging operation are relatively accurate with respect to current states of charge of the cells of battery 110 when battery management component 120 is to balance the states of charge.

Furthermore, battery management component 120 may use a timeout timer to determine when to perform passive battery cell balancing, as described herein, after a charging operation has ended. For example, to prevent battery management component 120 from performing passive battery cell balancing immediately after battery charger 230 is disconnected from battery 110 (e.g., accidentally, due to a temporary failure or shutdown, and/or the like), battery management component 120 may wait to initiate passive battery cell balancing until the timeout timer has expired following the end of the charging operation.

Accordingly, referring to the example of FIG. 1, battery management component 120 may determine that C1 reached a 100% state of charge. Based on C1 reaching a 100% state of charge, battery management component 120 may determine that a charging operation involving battery 110 and battery charger 230 is to end. For example, rather than balancing C1 with one or more of the remaining cells (e.g., C2 or C3) during the charge operation to permit battery charger 230 to continue to charge the remaining cells (e.g., C2 and/or C3), battery management component 120 may cause the battery operation to end. In some implementations, battery management component 120 may cause battery charger 230 to be disconnected from battery 110 (e.g., using one or more switches and/or one or more mechanical devices).

User device 240 includes one or more devices capable of receiving, generating, storing, processing, and/or providing information associated with battery 110 and/or battery charger 230. User device 240 may permit a user to determine a state of charge of battery 110 (e.g., based on information received from battery management component 120). User device 240 may include a communication and/or computing device of an operator station associated with a machine that utilizes battery 110 for power. Additionally, or alternatively, user device 240 may include one or more other types of computing devices, such as a mobile phone (e.g., a smart phone, a radiotelephone, etc.), a laptop computer, a tablet computer, a handheld computer, a desktop computer, a wearable communication device (e.g., a smart wristwatch, a pair of smart eyeglasses, etc.), or a similar type of device.

Battery management component 120 may communicate state of charge information associated with battery 110 to the user device (e.g., to permit a user to access the state of charge information). For example, based on one of the cells of battery 110 reaching a maximum state of charge (e.g., C1 of system 100), battery management component 120 may indicate that a charging operation can be ended (e.g., to cause the user to disconnect battery charger 230). In the event that the charging operation is not ended, battery management component 120 may perform passive cell balancing while the charging operation continues, to permit one or more other cells to reach a maximum state of charge.

The number and arrangement of devices shown in FIG. 2 are provided as an example. In practice, there may be additional devices, fewer devices, different devices, or differently arranged devices than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
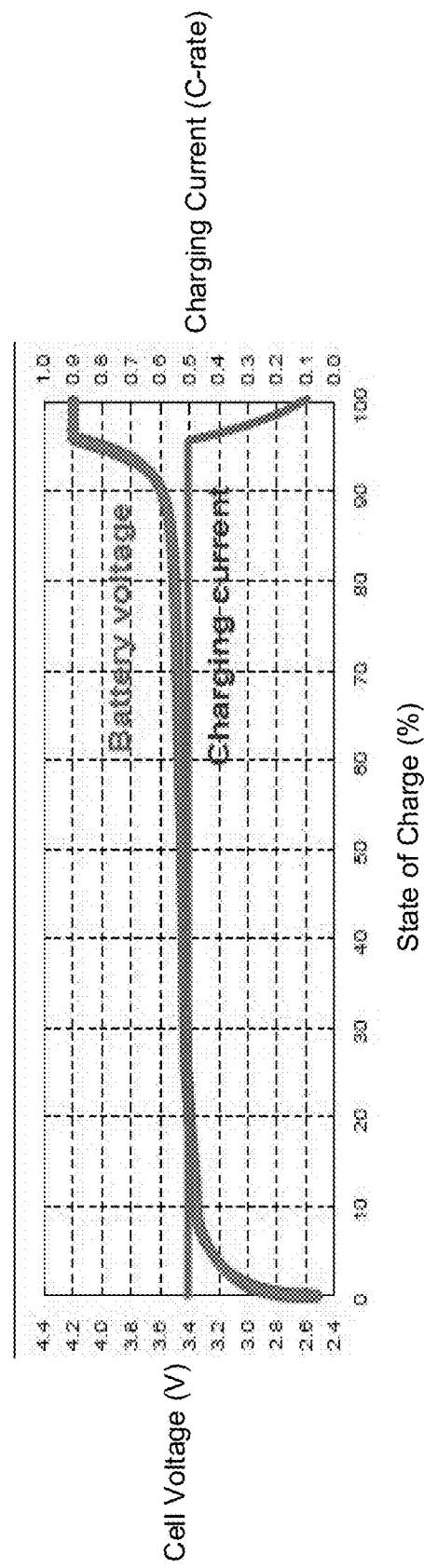
FIG. 3 is a diagram of an example implementation associated with passive battery cell discharge, as described herein.

FIG. 3 is a diagram of an example implementation 300 associated with passive battery cell discharge, as described herein. FIG. 3 includes a graph that is representative of a state of charge mapping that may be used by a battery management component (e.g., battery management component 120), as described herein. As shown in FIG. 3, the battery management component may determine a state of charge of a cell of a battery (e.g., battery 110) based on a measured cell voltage (V) and/or a charging current (C-rate). The graph illustrates that a particular range of the state of charge from 10% to 90% may correspond to a measured voltage range of approximately 3.3 V to 3.6 V. Accordingly, to accurately determine the state of charge of a cell, the battery management component may determine the measured voltage of cells within hundredths of volts (0.01 V) and/or within millivolts (mV) (0.001). To determine the state of charge of the cell with such accuracy, the battery management component may determine and record the state of charge while the battery is in a steady state (e.g., while the battery is charging or connected to a battery charger).

As described herein, the battery management component may determine the difference between a state of charge of two or more cells. The battery management component may determine the state of charge between cells once the battery management component determines that one of the cells has reached a maximum state of charge (e.g., based on a measured voltage from the cell). Further, the battery management component may record all measured voltages for all cells of the battery when the battery management component determines that one of the cells has reached a maximum state of charge.

The battery management component may convert the measured voltages to a corresponding state of charge (e.g., which may be represented by a percentage). The battery management component may use a look up table that maps measured voltages of cells to corresponding states of charge for the cells. Such a look up table may be represented (or mapped) in the graph of implementation 300. For example, to determine the state of charge of a cell, the battery management component may look up a measured voltage of the cell. As a specific example, as shown in FIG. 3, the battery management component may determine that a measured voltage 4.2 V corresponds to 100% state of charge, that a measured voltage of 3.6 V corresponds to a 90% state of charge, that a measured voltage of 3.4 V corresponds to a 20% state of charge, and so on. Similarly, the battery management component may look up the charging current of the cell to determine the state of charge. One or more factors (e.g., temperature, cell relaxation, and/or the like) may be considered in determining the state of charge and/or generating one or more different mappings based on the one or more factors. Accordingly, the battery management component may determine the state of charge of a cell based on one or more of a measured voltage from the cell, a temperature associated with the battery (e.g., as determined by a temperature sensor of the battery), a cell relaxation factor associated with the cell, and/or the like.

According to some implementations, the battery management component identifies the cell of the battery that has the lowest state of charge (e.g., using state of charge information that is generated and/or stored during a charging operation). To determine whether cells of the battery are unbalanced, for each cell, the battery management component may find the difference between the state of charge of that cell and the lowest state of charge. If the difference between the state of charge of one cell and the lowest state of charge of all of the cells is greater than the threshold range, the battery management component may determine that the cells of the battery are unbalanced and energy from one or more of the cells is to be passively discharged.

To perform the passive cell battery discharge, the battery management component may determine the amount of energy to remove from each cell and/or a length of time that a bleed resistor is to be activated. For example, the battery management component may use the following analysis to control removal of energy from a cell:

$$\Delta SOC_i \text{-} Cap_i \times SOH_i = E_D \quad (1)$$

where $\times SOC_i$ is the difference in state of charge between the lowest state of charge and cell i, $Cap_i$ is the cell capacity (e.g., in Watt-hour) of cell i, $SOH_i$ is the state of health of cell i, and $E_D$ is the amount of energy that is to be discharged from cell i. The state of health may correspond to a percentage of an original capacity of a cell that is estimated to be available after usage of the battery (e.g., due to time, temperature cycles, charge cycles, discharge cycles, and/or the like). The state of health may be specific to each cell of the battery and/or the same for all cells of the battery. The battery management component may determine the state of health of the battery by monitoring usage of the battery using any suitable technique, receiving information that identifies the usage of the battery, and/or the like.

Using the above, if there is energy that is to be removed ($E_D > 0$), the battery management component may monitor the discharge of the amount of remaining energy that is to be removed based on the length of time that a bleed resistor has been activated to discharge energy from the cell using:

$$E_D - (I_D \times V_i \times T_{on}) = E_R \quad (2)$$

where $E_R$ is the amount of remaining energy that is to be removed, $I_D$ is the bleed resistor discharge current, $V_i$ is the voltage of cell i, and $T_{on}$ is the length of time that the bleed resistor has been activated.

Additionally, or alternatively, the battery management component may determine an amount of time based on the amount of charge (in amp-hours). The battery management component may use the following when the voltage of a cell is within a threshold range of a particular value:

$$\Delta SOC_i \times \text{Rated Cap}_i \times SOH_i = \text{Charge}_D \quad (3)$$

where Rated Cap, is the rated cell capacity (in amp-hours) and $\text{Charge}_D$ is the amount of charge that is to be removed (in amp-hours). From Equation 3, the battery management component may estimate the amount of time that the bleed resistor is to be activated using the following:

$$\frac{\text{Charge}_D}{I_D} = T_D \quad (4)$$

where $T_D$ is the discharge time (or length of time that the bleed resistor is to be activated to passively discharge the energy from the cell).

According to some implementations, the battery management component may only estimate the amount of time based on the remaining amount of charge that is to be discharged ($\text{Charge}_D$) when the measured voltage of the cell is in a nominal range (e.g., shown as the relatively flat portion of the graph in FIG. 3, between 3.4V and 3.6V, which corresponds to a range of 10% to 90% state of charge). For example, with reference to the graph of FIG. 3, the battery management component may estimate the length of time that a bleed resistor is to be activated when the voltage of the cell is within a threshold range of 3.4 V or when the state of charge of the cell for the cell is indicated (e.g., as measured during a charging operation) to be between 10% and 90%.

In this way, to perform passive battery cell balancing, the battery management component may calculate an amount of energy that is to be discharged from a cell and/or estimate an amount of time that a bleed resistor is to be activated to discharge a particular amount of energy from cell.

As indicated above, FIG. 3 is provided as an example. Other examples may differ from what was described in connection with FIG. 3.

Figure 4:
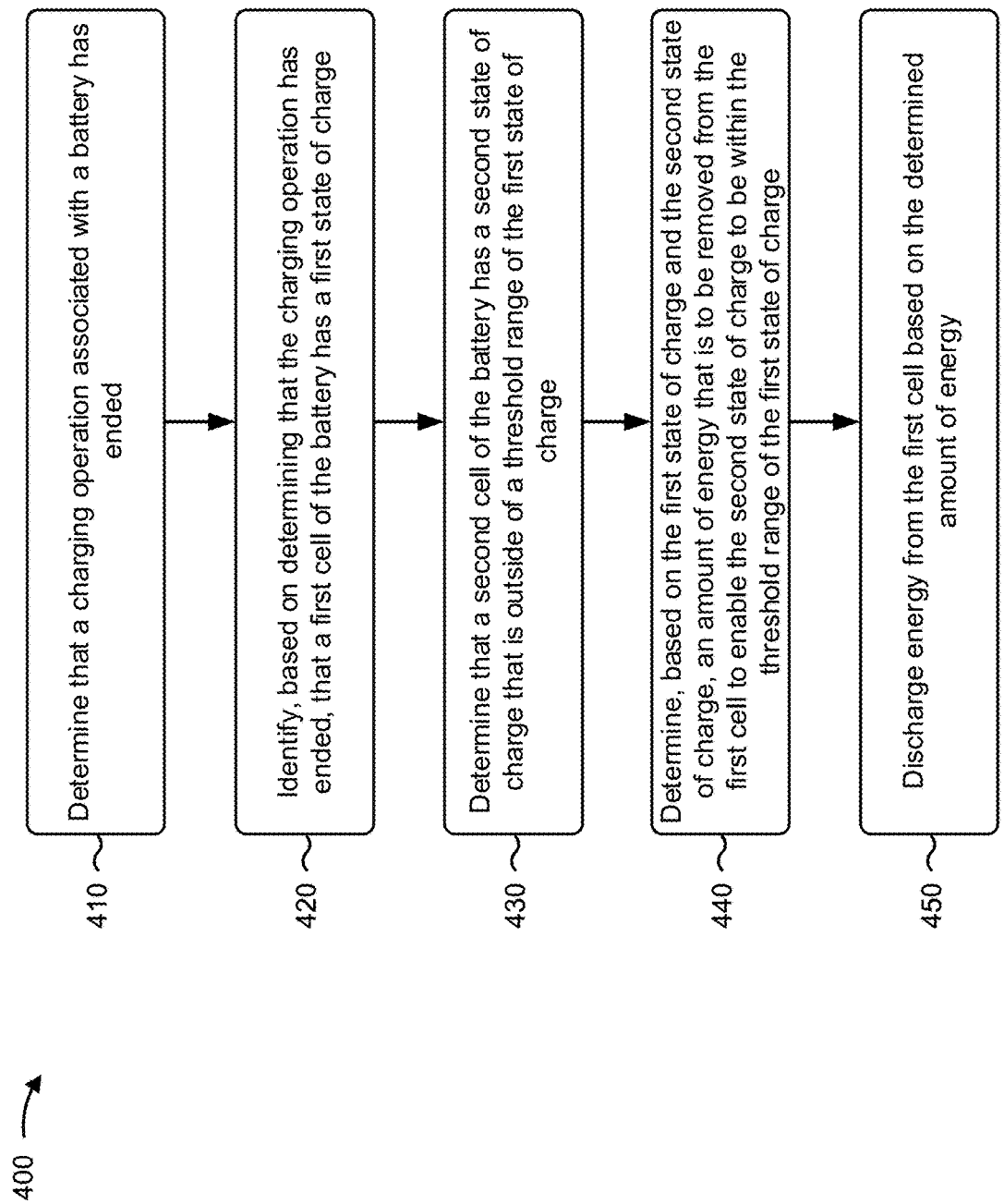
FIG. 4 is a flowchart of an example process for passive battery cell discharge as described herein.

FIG. 4 is a flowchart of an example process 400 for passive battery cell discharge. In some implementations, one or more process blocks of FIG. 4 may be performed by a battery management component (e.g., battery management component 120). One or more process blocks of FIG. 4 may be performed by another device or a group of devices separate from or including the battery management component, such as a battery charger (e.g., battery charger 230), a user device (e.g., user device 240), and/or the like.

As shown in FIG. 4, process 400 may include determining that a charging operation associated with a battery has ended (block 410). For example, the battery management component may determine that a charging operation associated with a battery has ended, as described above. The charging operation may be determined to have ended based on the battery being disconnected from a battery charger.

As further shown in FIG. 4, process 400 may include identifying, based on the charging operation ending, that a first cell of the battery has a first state of charge (block 420). For example, the battery management component may identify, based on the charging operation ending, that a first cell of the battery has a first state of charge, as described above.

The first state of charge may be identified based on being a highest state of charge relative to states of charge of a plurality of cells of the battery. The first state of charge may be a highest state of charge relative to states of charge of a plurality of cells of the battery, and the second state of charge may be a lowest state of charge relative to the states of charge of the plurality of cells. The charging operation may be ended based on the first state of charge being a maximum state of charge for the first cell.

As further shown in FIG. 4, process 400 may include determining that a second cell of the battery has a second state of charge that is outside of a threshold range of the first state of charge (block 430). For example, the battery management component may determine that a second cell of the battery has a second state of charge that is outside of a threshold range of the first state of charge, as described above.

According to some implementations, the battery management component may measure, during the charging operation, the first state of charge and the second state of charge and store, based on the charging operation ending, information identifying the first state of charge and the second state of charge in a data structure. The first state of charge may correspond to a most recently measured state of charge of the first cell and the second state of charge may correspond to a most recently measured state of charge of the second cell.

As further shown in FIG. 4, process 400 may include determining, based on the first state of charge and the second state of charge, an amount of energy that is to be removed from the first cell to enable the second state of charge to be within the threshold range of the first state of charge (block 440). For example, the battery management component may determine, based on the first state of charge and the second state of charge, an amount of energy that is to be removed from the first cell to enable the second state of charge to be within the threshold range of the first state of charge, as described above.

As further shown in FIG. 4, process 400 may include discharging energy from the first cell based on the determined amount of energy (block 450). For example, the battery management component may discharge, by the device, energy from the first cell based on the determined amount of energy, as described above.

The battery management component may determine a length of time during which a bleed resistor, associated with the first cell, is to be activated to discharge the amount of the energy from the first cell, and discharge the energy from the first cell for the determined length of time. When discharging the energy, the battery management component may activate a bleed resistor associated with the first cell for a duration that is based on the amount of energy and a resistance of the bleed resistor.

Additionally, or alternatively, based on determining that the charging operation ended, the battery management component may determine a plurality of states of charge of a plurality of cells of the battery and identify a lowest state of charge of the plurality of states of charge. The battery management component may determine that at least one cell of the plurality of cells has reached a maximum state of charge and perform an action to cause the charging operation to end and/or that causes the charging operation to end (e.g., notify an operator, notified an automated battery charger to end the charging operation, disconnect a battery charger, cause an autonomous vehicle associated with the vehicle to end the charging operation, and/or the like).

The battery management component may determine that a set of states of charge of corresponding cells, of the plurality of cells, are outside of a threshold range of the lowest state of charge e. The battery management component may determine respective amounts of energy that are to be removed from the corresponding cells to enable the states of charge of the corresponding cells to be within the threshold range from the lowest state of charge.

To balance the set of cells with the cell with the lowest state of charge, the battery management component may activate, for corresponding durations, respective bleed resistors associated with of the corresponding cells. The lengths of the corresponding durations are based on the respective amounts of energy that are determined to be removed from the corresponding cells. Accordingly, a first cell of the set of cells may have a first state of charge and a second cell of the set of cells may have a second state of charge that is different from the first state of charge. In such a case, a first amount of energy that is discharged from the first cell may be different from a second amount of energy that is discharged from the second cell.

The battery management component may determine the lengths of the corresponding durations based on the corresponding amounts of energy and based on a mapping of a plurality of amounts of energy to corresponding lengths of durations for which the bleed resistors are to be activated. The bleed resistors may be activated within a threshold time period of the charge operation ending.

Based on determining that a charging operation has ended, the battery management component may compare the states of charge of the plurality of cells and determine that a first state of charge of a first cell of the plurality of cells is unbalanced relative to a second state of charge of a second cell of the plurality of cells. For example, the battery management component may determine that the first state of charge and the second state of charge are outside of a threshold range of one another. The first state of charge may correspond to a maximum state of charge of the first cell. Information identifying the states of charge may be stored in a data structure during the charging operation.

Based on a difference between the first state of charge and the second state of charge, the battery management component may estimate an amount of energy that is to be removed from the first cell to balance the first state of charge with the second state of charge. The battery management component may discharge, via a bleed resistor of a plurality of bleed resistors, energy from the first cell based on the estimated amount of energy. The energy may be discharged for a duration that is based on the estimated amount of energy. The energy may be discharged during operation of a machine associated with the battery.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

INDUSTRIAL APPLICABILITY

Due to various factors, such as production processes and/or different wear during operation of a machine that utilizes a battery, cells of the battery may have different capacities and/or states of charge. Accordingly, some of the cells, during a charging operation, may charge to a maximum state of charge more quickly than other cells. In such cases, the charging of the battery should be stopped as soon as one of the cells reaches the maximum state of charge to avoid damage to the cell, the battery, and/or other components of the machine. Furthermore, during operation of the machine and/or usage of the battery, due to the different capacities of the cells, one or more of the cells may discharge energy more quickly than others and/or may reach a minimum state of charge (e.g., a state of charge that corresponds to an operable range of the cell) more quickly than other cells. Again, in such cases, the usage of the battery (or discharge of energy from the battery) should be stopped as soon as one of the cells reaches the minimum state of charge (e.g., to avoid damage to the battery, to ensure available energy remains in the other cells to complete an operation of the machine, and/or the like). To maximize a lifetime and/or usage of cells of the battery, the cells of the battery are to remain in balance as closely as possible.

Typically, because the cells of the battery are in a relatively steady state, the cells may be balanced during a charging operation. The cells being in the steady state enables an accurate determination of the amount of energy in each of the cells. Once the charging operation is complete (e.g., after a battery charger is disconnected from the battery), the cells of the battery are no longer in a steady state, which decreases an ability to accurately determine the state of charge of each of the cells. Therefore, typically, cells of the battery may be balanced during a charging operation that completely charges all cells of the battery. However, balancing the cells during a charge operation can be a relatively time-consuming process because cells of the battery are charged to a maximum state of charge and then discharged to permit remaining cells that are not at the maximum state of charge to receive additional charge. These charging and discharging cycles are repeated until all cells reach the maximum state of charge. Accordingly, to fully charge a relatively large battery (e.g., a battery to power movement in an autonomous vehicle) may require several hours of charging the battery (e.g., twelve hours or more). Accordingly, for such autonomous vehicles to be used in association with an operation, it is desirable to reduce an amount of charging time during the operation to permit the autonomous vehicles to be operational for longer periods of time during the operation.

According to some implementations described herein, cells of a battery are passively discharged to ensure that the cells are in balance (e.g., that energy stored in the cells of the battery are within a threshold range of one another). The cells are passively discharged according to a measured state of charge of the cells of the battery that occurred during a charging operation. For example, during a charging operation, a battery management component may record and/or update measured states of charge of the cells. Accordingly, as soon as the charging operation ends (e.g., as soon as a battery charger is disconnected), the battery management component may refer to the recorded measured states of charge and determine amounts of energy that are to be discharged from each of the cells to bring the cells into balance. Accordingly, the cells of the battery may be discharged during an operation of a machine to permit the machine to return to operation more quickly than if the machine had to wait for all cells of the battery to be fully charged by the charging operation (which would involve several cycles of charging and discharging a plurality of cells).

Furthermore, the overall downtime of the machine (e.g., over a relative long term, such as a term of an operation) may be decreased. Although the machine may need to engage in more frequent charging operations if the battery is not fully charged (all cells of the battery are not at a maximum state of charge), the more frequent charging operations allow less time between operations for the cells to become unbalanced. Less time between charging operations corresponds to less of a difference between states of charge of the battery when the machine returns to charge the battery. In this way, when a cell of a battery is fully charged during a subsequent charging operation that follows a passive cell balancing, as described herein, the battery may correspondingly receive relatively similar amounts of energy as a charging operation that fully charges the battery, but in considerably less time. The length of time may be considerably less because several discharge cycles of cells with maximum states of charge during a charging operation are not required in order to balance the cells of the battery during the charging operation, since the cells of the battery were balanced using the passive cell battery discharge. Furthermore, during the subsequent charge, the cells should remain relatively in balance, and therefore all cells of the battery should be near the maximum state of charge at the completion of the subsequent charging operation.

Because the battery management component records the measured states of charge during the charging operation (e.g., while the battery cells are in a steady state), the measured states of charge may be relatively accurate based on measured voltages (e.g., within 5 mVs) of the cells. In this way, the battery management component may determine and store relatively accurate states of charge of the cells (rather than use measured voltages while the battery is under operation or not in a steady state) to ensure that a most appropriate amount of energy is to be discharged from corresponding cells to bring the states of charge of the cells of the battery within balance (e.g., within states of charge that correspond to the cells having a voltage output within 10 mV or less). Furthermore, as described herein, the battery management component may perform passive battery cell balancing within a threshold period of time from the charging operation ending to ensure that the record states of charge most accurately correspond to current states of charge of the cells of the battery while the battery is under operation.

Furthermore, as mentioned above, cell balancing that is performed to charge a battery involves several cycles of charging and discharging cells of the battery. The more charging cycles and/or discharging cycles that a cell undergoes, the lower the state of health or remaining useful life of the cell. As described herein, cell balancing may be performed after one cell of the battery reaches a maximum state of charge. From there, the cells of the battery may be balanced (e.g., relative to a lowest state of charge at the time that cell reached the maximum state of charge) to avoid causing the cells to undergo several cycles of charging and/or discharging the cells during the charging process. In other words, as described herein, relative to a charging operation, there may be only one cycle of charging (e.g., during the charge) and one cycle of discharging (during the cell balancing). In this way, the battery management component may prolong the state of health of the battery (or cells of the battery) and/or extend the useful life of the battery.

In this way, a battery management component is provided to permit passive cell balancing to occur during operation of a machine.

What is claimed is:

1. A method, comprising:
   determining, by a device, that a charging operation associated with a battery has ended;
   identifying, by the device and based on determining that the charging operation has ended, that a first cell of the battery has a first state of charge;
   determining, by the device, that a second cell of the battery has a second state of charge that is outside of a threshold range of the first state of charge;
   determining, by the device and based on the first state of charge and the second state of charge, an amount of energy that is to be removed from the first cell to enable the first state of charge to be within the threshold range of the second state of charge;
   discharging, by the device, energy from the first cell based on the determined amount of energy;
   identifying, by the device, a length of time associated with discharging the energy from the first cell; and
   resuming, by the device and based on the length of time associated with discharging the energy from the first cell, passive discharging of the first cell upon startup of a machine associated with the battery.

2. The method of claim 1, wherein the charging operation is determined to have ended based on the battery being disconnected from a battery charger.

3. The method of claim 1, further comprising:
measuring, during the charging operation, the first state of charge and the second state of charge; and
storing, based on the charging operation ending, information identifying the first state of charge and the second state of charge in a data structure,
wherein the first state of charge corresponds to a most recently measured state of charge of the first cell and the second state of charge corresponds to a most recently measured state of charge of the second cell.

4. The method of claim 1, wherein the first state of charge is identified based on being a highest state of charge relative to states of charge of a plurality of cells of the battery.

5. The method of claim 1, wherein the first state of charge is a highest state of charge relative to states of charge of a plurality of cells of the battery and the second state of charge is a lowest state of charge relative to the states of charge of the plurality of cells.

6. The method of claim 1, wherein identifying the length of time associated with discharging the energy from the first cell comprises:
determining the length of time associated with discharging the energy from the first cell based on a length of time during which a bleed resistor, associated with the first cell, has been activated to discharge the energy from the first cell.

7. The method of claim 1, wherein discharging the energy comprises:
activating a bleed resistor associated with the first cell for a duration that is based on the amount of energy and a resistance of the bleed resistor.

8. The method of claim 1, wherein the charging operation is ended based on the first state of charge being a maximum state of charge for the first cell.

9. A device, comprising:
one or more memories; and
one or more processors, communicatively coupled to the one or more memories, to:
determine that a charging operation associated with a battery has ended;
determine, based on determining that the charging operation ended, a plurality of states of charge of a plurality of cells of the battery;
identify a lowest state of charge of the plurality of states of charge;
determine that a set of states of charge of corresponding cells, of the plurality of cells, are outside of a threshold range of the lowest state of charge;
determine respective amounts of energy that are to be removed from the corresponding cells to enable the states of charge of the corresponding cells to be within the threshold range from the lowest state of charge; and
activate, for corresponding durations, respective bleed resistors associated with the corresponding cells;
identify a length of time that a bleed resistor, of the respective bleed resistors, has been activated; and
resume, based on the length of time that the bleed resistor has been activated, passive discharging of a cell, of the corresponding cells, upon startup of a machine associated with the battery.

10. The device of claim 9, wherein the one or more processors are further to:
determine that at least one cell of the plurality of cells has reached a maximum state of charge; and
perform an action to cause the charging operation to end.

11. The device of claim 9, wherein the one or more processors are further configured to:
measure, during the charging operation, the plurality of states of charge of the plurality of cells; and
store, based on the charging operation ending, information identifying the plurality of states of charge in a data structure,
wherein the plurality of states of charge correspond to most recently measured states of charge of the plurality of cells.

12. The device of claim 9, wherein the one or more processors are further to:
determine the lengths of the corresponding durations based on the respective amounts of energy and a mapping of a plurality of amounts of energy to corresponding lengths of durations that the respective bleed resistors are to be activated.

13. The device of claim 9, wherein the respective bleed resistors are activated within a threshold time period of the charge operation ending.

14. The device of claim 9, wherein a first cell of the corresponding cells has a first state of charge and a second cell of the corresponding cells has a second state of charge that is different from the first state of charge, and
wherein a first amount of energy that is discharged from the first cell is different from a second amount of energy that is discharged from the second cell.

15. A system comprising:
a battery that includes a plurality of cells;
a plurality of bleed resistors coupled to the plurality of cells; and
a battery controller configured to:
determine that a charging operation associated with the battery has ended;
compare, based on determining that the charging operation has ended, states of charge associated with the plurality of cells;
determine, based on comparing the states of charge, that a first state of charge of a first cell of the plurality of cells is unbalanced relative to a second state of charge of a second cell of the plurality of cells;
estimate, based on a difference between the first state of charge and the second state of charge, an amount of energy that is to be removed from the first cell to balance the first state of charge with the second state of charge;
discharge, via a bleed resistor of the plurality of bleed resistors, energy from the first cell based on the estimated amount of energy;
identify a length of time that the bleed resistor has been activated; and
resume, based on the length of time that the bleed resistor has been activated, passive discharging of the first cell upon startup of a machine associated with the battery.

16. The system of claim 15, wherein the first state of charge and the second state of charge are outside of a threshold range of one another.

17. The system of claim 15, wherein information identifying the states of charge of the plurality of cells is stored in a data structure during the charge operation.

18. The system of claim 15, wherein the first state of charge corresponds to a maximum state of charge of the first cell.

19. The system of claim 15, wherein the energy is discharged for a duration that is based on the estimated amount of energy.

20. The system of claim 15, wherein the battery controller is further configured to:

determine an amount of remaining energy that is to be removed based on the estimated amount of energy and the length of time that the bleed resistor has been activated, and wherein the passive discharging of the first cell is resumed based on the amount of remaining energy that is to be removed.

\* \* \* \* \*